(12) United States Patent
Kanno et al.

(10) Patent No.: US 9,698,667 B2
(45) Date of Patent: Jul. 4, 2017

(54) SEMICONDUCTOR DEVICE AND POWER CONVERTER EQUIPMENT

(71) Applicant: FUJI ELECTRIC CO., LTD., Kawasaki (JP)

(72) Inventors: Hiroshi Kanno, Matsumoto (JP); Hitoshi Sumida, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 127 days.

(21) Appl. No.: 14/734,665

(22) Filed: Jun. 9, 2015

(65) Prior Publication Data

US 2016/0020685 A1    Jan. 21, 2016

(30) Foreign Application Priority Data

Jul. 17, 2014   (JP) ................. 2014-146487

(51) Int. Cl.
*H02M 1/08*   (2006.01)
*H02M 7/538*   (2007.01)
*H03K 17/0412*   (2006.01)

(52) U.S. Cl.
CPC ............. *H02M 1/08* (2013.01); *H02M 7/538* (2013.01); *H03K 17/04123* (2013.01)

(58) Field of Classification Search
CPC .. H02M 1/08; H02M 7/537; H03K 17/04123; H03K 19/018521
See application file for complete search history.

(56) References Cited

U.S. PATENT DOCUMENTS

| | | | |
|---|---|---|---|
| 5,075,579 A * | 12/1991 | Ueno ............. | H03K 19/017527 326/17 |
| 7,576,574 B2 * | 8/2009 | Noda ................. | H05B 33/0812 327/108 |
| 7,759,987 B2 * | 7/2010 | Hishikawa ......... | H03K 3/35613 327/112 |
| 2009/0189670 A1 * | 7/2009 | Yang ............. | H03K 19/018521 327/333 |
| 2011/0181341 A1 * | 7/2011 | Ishibashi ................ | G09G 3/296 327/333 |
| 2012/0235712 A1 | 9/2012 | Yamaji | |
| 2013/0038356 A1 * | 2/2013 | Heo ................. | H03K 17/08122 327/109 |

FOREIGN PATENT DOCUMENTS

JP    4660975    1/2011
JP    2012-519371    8/2012

* cited by examiner

*Primary Examiner* — Matthew Nguyen

(57) ABSTRACT

A semiconductor device that has a level shift circuit, an anterior stage circuit, and a posterior stage circuit. The level shift circuit transmits an input signal from a primary potential system to a secondary potential system different from the primary potential system. The anterior stage circuit including a first transistor receives a gate driving signal delivered by the level shift circuit. The posterior stage circuit including a second transistor with the same channel type as that of the first transistor drives a switching element according to the output signal from the first transistor. The threshold voltage of the first transistor is set at a lower value than the threshold voltage of the second transistor.

9 Claims, 9 Drawing Sheets

FIG.4
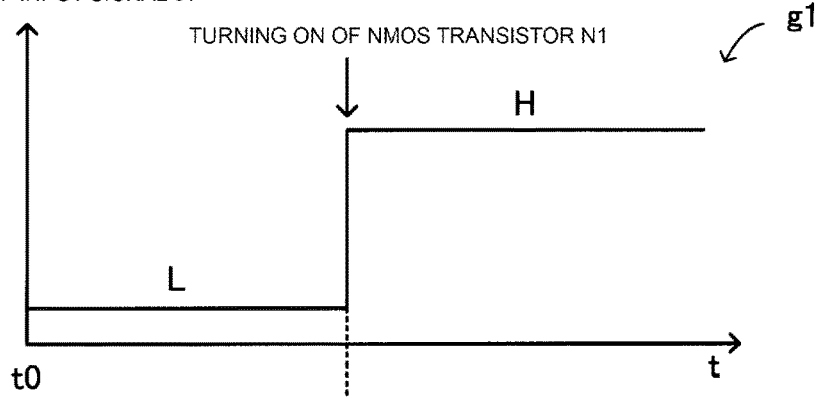
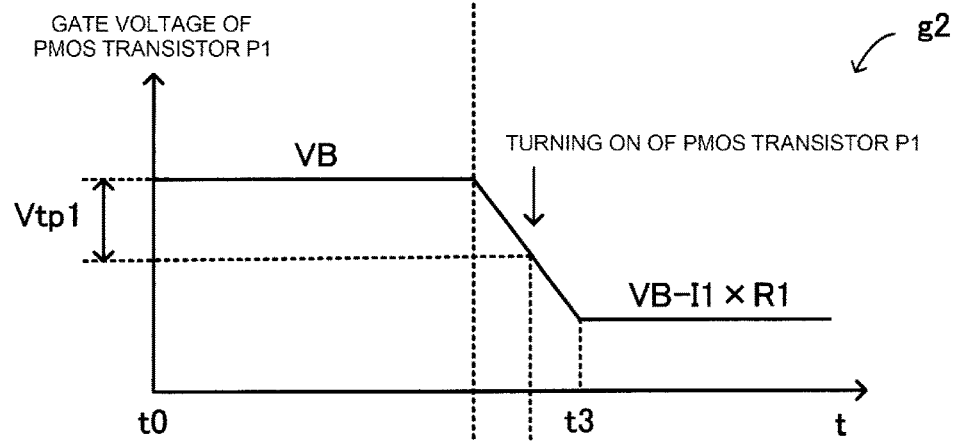
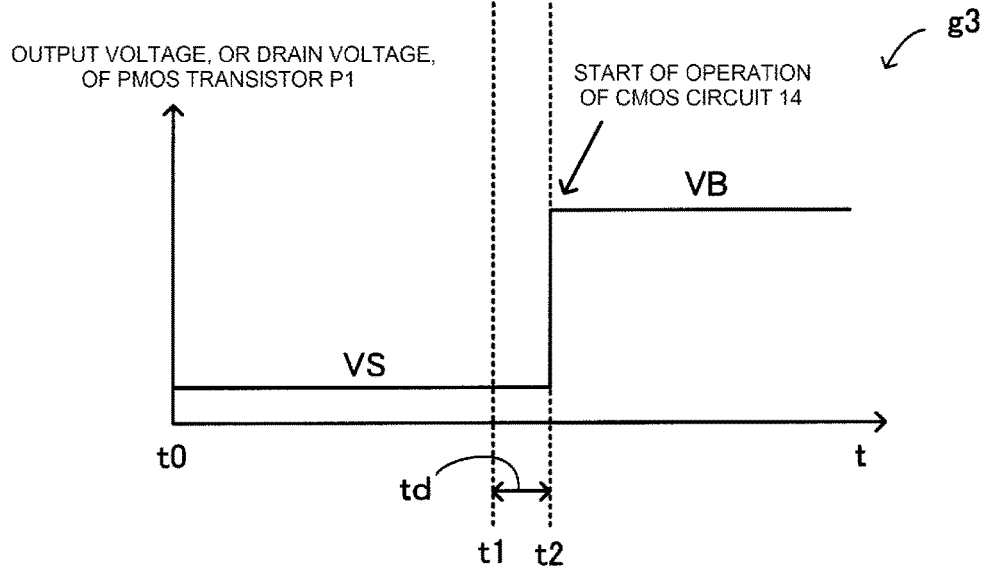

FIG.6
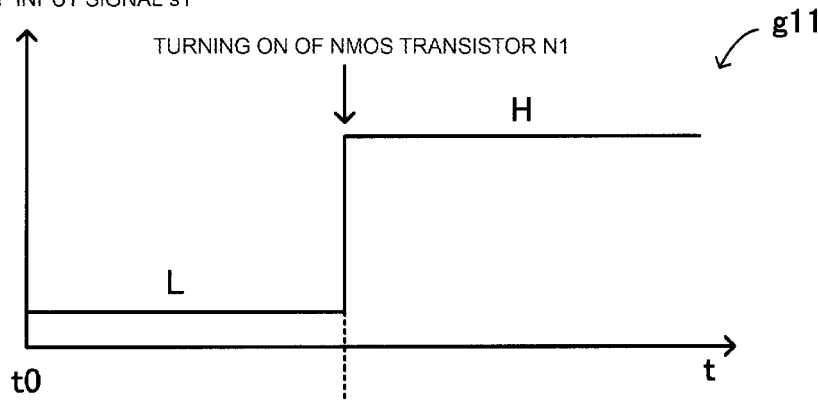
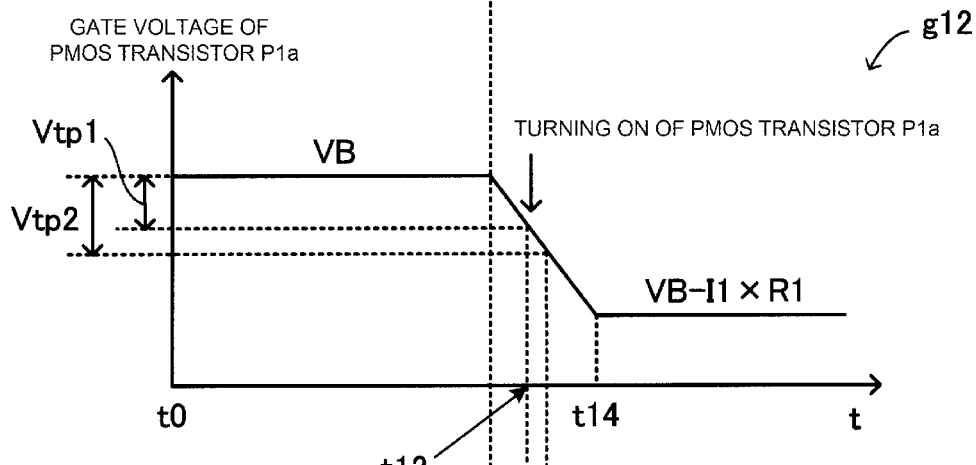
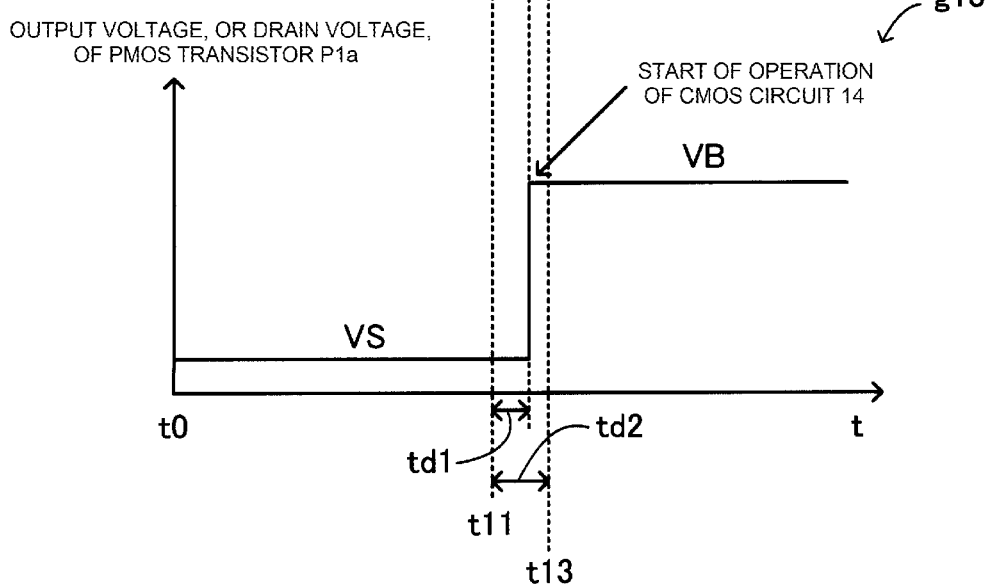

SEMICONDUCTOR DEVICE AND POWER CONVERTER EQUIPMENT

CROSS-REFERENCE TO RELATED APPLICATIONS

This application is based on, and claims priority to Japanese Patent Application No. 2014-146487, filed on Jul. 17, 2014, the content of which is incorporated herein by reference in its entirety.

BACKGROUND

1. Field

The present disclosure relates to a semiconductor device and power converter equipment having the semiconductor device.

2. Description of Related Art

Inverter apparatuses and power supply apparatuses used in low power capacity power conversion equipment are provided with switching elements such as insulated gate bipolar transistors (IGBTs).

Recently, driving circuits for the switching elements widely use a high voltage integrated circuit (HVIC) that serves the level shift function for driving the switching element in a high voltage side by an input signal from a low voltage side.

An example of circuit construction having switching elements is a bridge circuit composed of series-connected switching elements for driving a load.

The bridge circuit has a series connection of a switching element in the high voltage side and a switching element in the low voltage side. A load is connected at the middle potential point between the two switching elements. The switching element in the high potential side and the switching element in the low potential side are driven on different base potentials.

Two technologies have been conventionally proposed. Patent Document 1 discloses a technology in which a level shift circuit uses a high withstand voltage MOSFET with reduced parasitic capacitance. Patent Document 2 discloses a high withstand voltage output circuit that avoids malfunction during a maintaining period such as plasma display in the process of power supply voltage rising up.

Patent Document 1

Japanese Patent Application Publication No. 2012-519371 (PCT publication WO 2011/040016)

Patent Document 2

Japanese Patent Application 2002-374158 (Japanese Patent No. 4660975)

An HVIC comprises a level shift circuit and a complementary metal oxide semiconductor (CMOS) circuit disposed at the stage subsequent to the level shift circuit. In the HVIC, a transistor in the level shift circuit performs ON/OFF operation according to the level of the input signal; and the switching operation of the transistor drives ON/OFF operation of the CMOS circuit. The output signal from the CMOS circuit drives the switching element in the bridge circuit.

In this system, it takes a certain time to change the gate voltage of the transistor in the level shift circuit responding to the change of the input signal level. This required time affects the starting time of operation of the CMOS circuit.

Thus, the level shift control of the HVIC is one of the factors to retard the response time of the switching element from the change of the input signal level. Thus, the decrease of the delay time in the signal transmission in the HVIC is required.

SUMMARY

Embodiments of the present invention have been made in view of this situation, and an aspect of the present invention is to provide a semiconductor device and power conversion equipment in which a delay time in signal transmission is reduced.

To address the above problem, one aspect of the present invention provides a semiconductor device for driving a switching element. The semiconductor device comprises: a level shift circuit that transmits an input signal of a primary potential system to a secondary potential system different from the primary potential system; an anterior stage circuit that comprises a first transistor receiving a gate driving signal delivered by the level shift circuit; and a posterior stage circuit that comprises a second transistor with the same channel type as the one in the first transistor and driving the switching element according to an output signal from the first transistor; wherein a first threshold voltage of the first transistor is lower than a second threshold voltage of the second transistor.

A semiconductor device and power conversion equipment of embodiments of the present invention decreases a delay time in signal transmission.

BRIEF DESCRIPTION OF THE DRAWINGS

These and/or other aspects and advantages will become apparent and more readily appreciated from the following description of the embodiments, taken in conjunction with the accompanying drawings of which:

FIG. 4 shows an example of relationship between variation of an input signal level and variation of gate and drain voltages of a PMOS transistor;

FIG. 6 shows another example of relationship between variation of an input signal level and variation of gate and drain voltages of a PMOS transistor;

DESCRIPTION OF EMBODIMENTS

Figure 1:
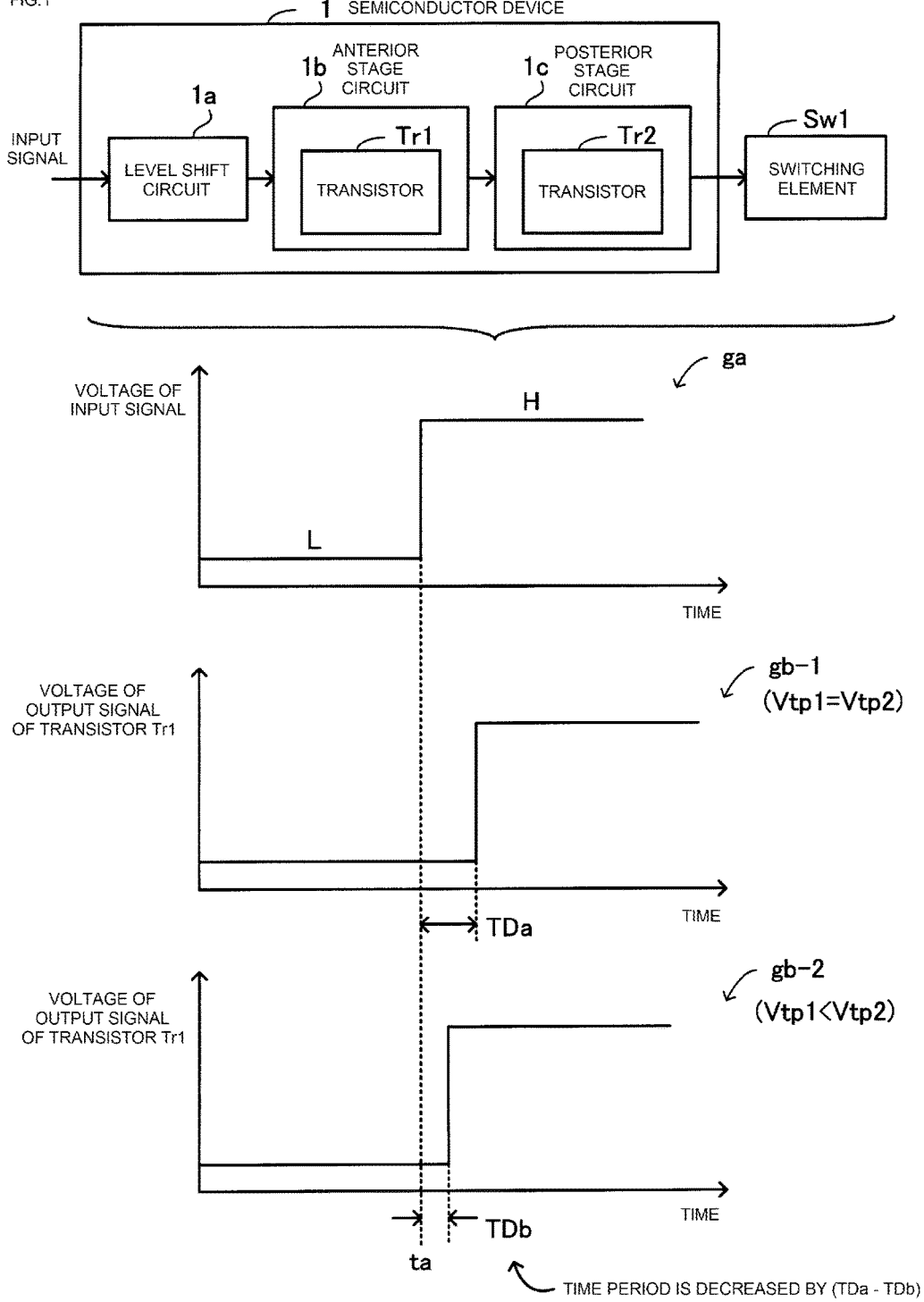
FIG. 1 shows an example of construction of a semiconductor device.

The following describes a semiconductor device according to an embodiment of the present invention with reference to the accompanying drawings. FIG. 1 shows an example of construction of a semiconductor device. A semiconductor device 1 comprises a level shift circuit 1a, an anterior circuit 1b, and a posterior circuit 1c, and drives a switching element Sw1. The semiconductor device 1 corresponds, for example, to an HVIC.

The level shift circuit 1a level-shifts a voltage level of an input signal in a low voltage side to a voltage level in a high voltage side, the latter being required for driving the switching element Sw1.

The anterior stage circuit 1b having a first transistor Tr1 receives a gate driving signal delivered by the level shift circuit 1a.

The posterior stage circuit 1c having a second transistor Tr2 with the same channel type as that in the transistor Tr1 drives the switching element Sw1 according to the output signal from the transistor Tr1.

A threshold voltage Vtp1, a first threshold voltage, of the transistor Tr1 is set at a lower value than a threshold voltage Vtp2, a second threshold voltage, of the transistor Tr2: Vtp1<Vtp2.

The time chart ga in FIG. 1 shows variation of an input signal level given to the semiconductor device 1, wherein the ordinate represents a voltage of the input signal, and the abscissa represents time.

The time chart gb-1 shows variation of an output signal level of the transistor Tr1 in the case that the threshold voltage Vtp1 of the transistor Tr1 is equal to the threshold voltage Vtp2 of the transistor Tr2, wherein the ordinate represents a voltage of the output signal, and the abscissa represents time.

The time chart gb-2 shows variation of an output signal level of the transistor Tr1 in the case the threshold voltage Vtp1 of the transistor Tr1 is lower than the threshold voltage Vtp2 of the transistor Tr2, wherein the ordinate represents a voltage of the output signal, and the abscissa represents time.

The level of the input signal changes at the time ta from an L level to an H level. In the case of Vtp1=Vtp2 as shown in the time chart gb-1, it takes a time duration TDa to turn the transistor Tr1 ON and change the output signal level of the transistor Tr1 from the moment ta of change of the input signal level.

In the case of Vtp1<Vtp2 as shown in the time chart gb-2, it takes a time duration TDb, which is less than TDa, to turn the transistor Tr1 ON and change the output signal level of the transistor Tr1 from the moment ta of change of the input signal level.

Thus, the delay time is decreased by setting the threshold voltage Vtp1 of the transistor Tr1 in the anterior stage circuit 1b at a value lower than the threshold voltage Vtp2 of the transistor Tr2 in the posterior stage circuit 1c. The decreased time duration is the value of the time TDa subtracted by the time TDb.

Figure 2:
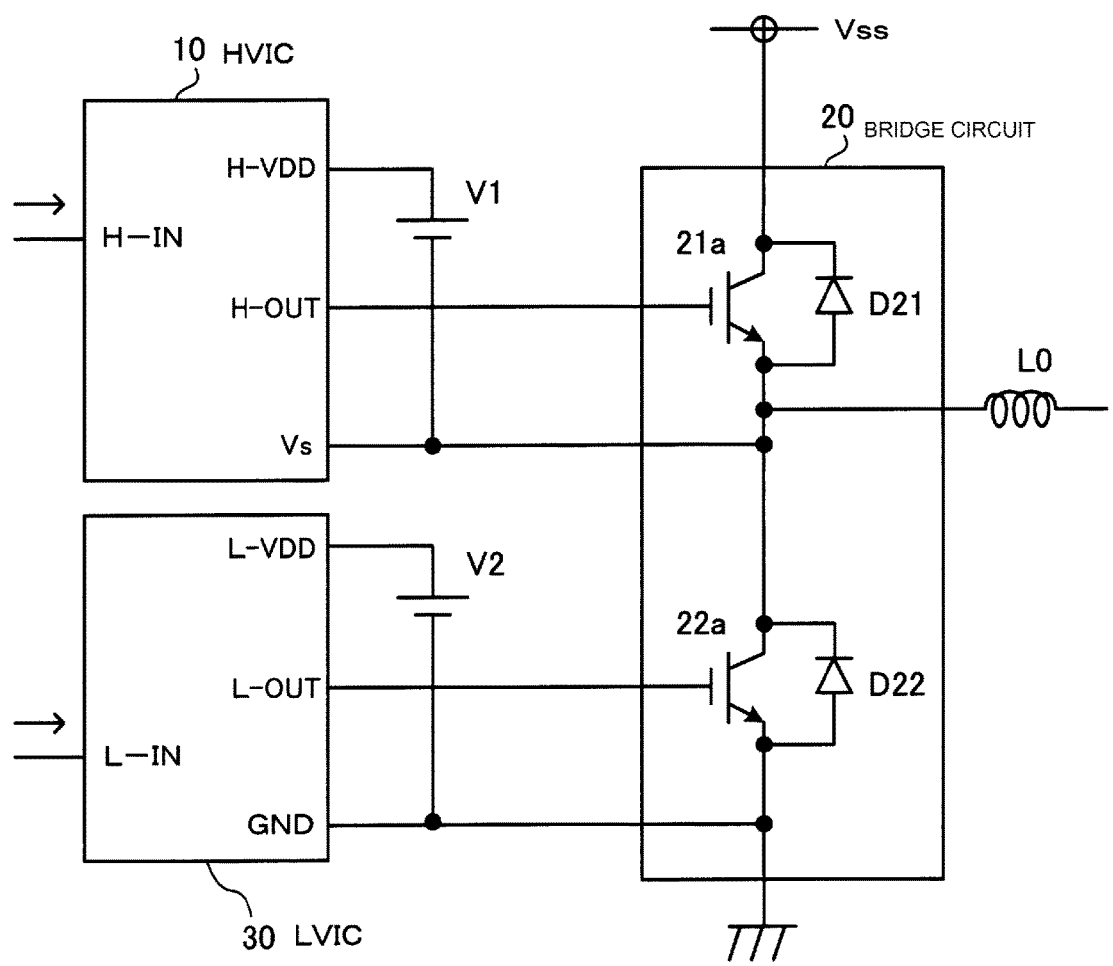
FIG. 2 shows an example of construction of a power conversion equipment.

Before a description of embodiments of the present invention, some description will be made about the construction of a power conversion equipment having an HVIC and the problems to be solved referring to FIGS. 2 through 4. FIG. 2 shows an example of construction of a power conversion equipment, and illustrates construction around a bridge circuit of the power conversion equipment.

The power conversion equipment 2 comprises: an HVIC 10, an LVIC (low voltage integrated circuit) 30, a bridge circuit 20, a power supply V1, a power supply V2, and an inductor L0 (or an L load). The bridge circuit 20 comprises switching elements of IGBTs 21a and 22a, and diodes D21 and D22.

The switching part in the high potential side having the IGBT 21a and the diode D21 is also referred to as an upper arm, and the switching part in the lower potential side having an IGBT 22a and the diode D22 is also referred to as a lower arm.

In the construction of the power conversion equipment of FIG. 2, the drive control of the upper arm is performed with the HVIC 10 and the drive control of the lower arm is performed with the LVIC 30. However, a single semiconductor integrated circuit can perform both functions for the HVIC 10 and the LVIC 30.

The HVIC 10 has terminals of a high potential side input terminal H-IN, a high potential terminal H-VDD, a high potential side output terminal H-OUT, and an intermediate potential terminal Vs.

The LVIC 30 has terminals of a low potential side input terminal L-IN, a low potential terminal L-VDD, a low potential side output terminal L-OUT, and a ground terminal GND.

Electrical connections among terminals and components in the power conversion equipment are as follows.

In the HVIC 10, the high potential terminal H-VDD is connected to the positive side terminal of the power supply V1. The high potential side output terminal H-OUT is connected to the gate of the IGBT 21a.

The intermediate potential terminal Vs is connected to: the negative side terminal of the power supply V1, the emitter of the IGBT 21a, the anode of the diode D21, an end of the inductor L0, the collector of the IGBT 22a, and the cathode of the diode D22. The collector of the IGBT 21a is connected to the power supply Vss and the cathode of the diode D21.

In the LVIC 30, the low potential terminal L-VDD is connected to the positive side terminal of the power supply V2. The low potential side output terminal L-OUT is connected to the gate of the IGBT 22a. The ground terminal GND is connected to the negative side terminal of the power supply V2, the emitter of the IGBT 22a, the anode of the diode D22, and the ground.

The bridge circuit 20 has a construction of a half bridge comprising the IGBTs 21a and 22a connected in series. The IGBT 21a in the upper arm and the IGBT 22a in the lower arm are turned ON alternately and deliver a high potential and a low potential alternately from the output terminal of the intermediate terminal Vs supplying alternating current to the load, which is the inductor L0.

A high potential is delivered from the intermediate potential terminal Vs when the IGBT 21a in the upper arm is in an ON state and the IGBT 22a in the lower arm is in an OFF state. A low potential is delivered from the intermediate potential terminal Vs when the IGBT 21a in the upper arm is in an OFF state and the IGBT 22a in the lower arm is in an ON state.

The gate signal to the IGBT 21a in the upper arm is delivered with a reference of a floating potential of the intermediate potential terminal Vs, thus, the potential at the intermediate terminal Vs is the base potential for driving the IGBT 21a in the upper arm.

The gate signal to the IGBT 22a in the lower arm is delivered with a reference of the ground potential. Thus, the ground potential is the base potential for driving the IGBT 22a in the lower arm.

The diodes D21 and D22 are used as free-wheeling diodes (FWDs). Because a reverse electromotive force develops in the inductor L0 at the moment of turning OFF of the IGBTs 21a and 22a, the load current is circulated through the diodes D1 and D2 that are connected antiparallel to the IGBTs 21a and 22a.

Figure 3:
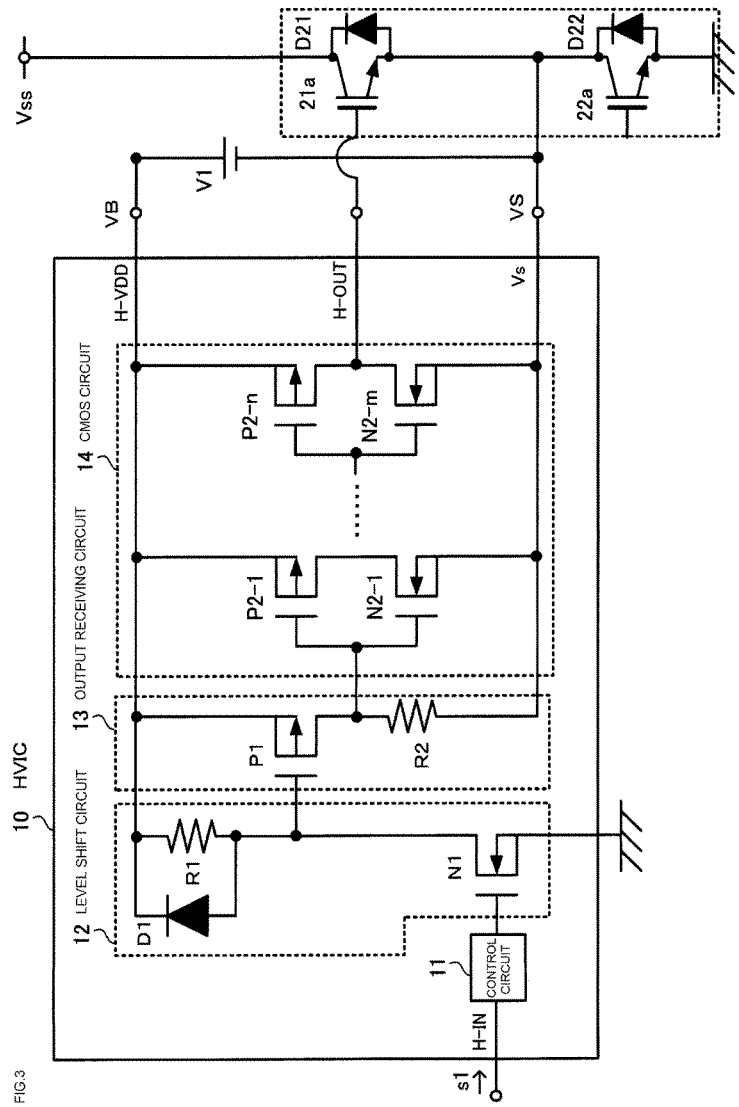
FIG. 3 shows an example of construction of an HVIC.

FIG. 3 shows an example of construction of an HVIC. The figure illustrates the parts within the HVIC 10 that drives the upper arm of the bridge circuit 20, as well as peripheral circuits.

The HVIC 10 comprises a control circuit 11, a level shift circuit 12, an output receiving circuit 13, and a CMOS circuit 14.

The control circuit 11 receives the input signal s1 from the input terminal H-IN and drives the level shift circuit 12.

The level shift circuit 12 includes a diode D1, a level shift resistor R1, and a high withstand voltage NMOS transistor N1 which is an n channel type MOSFET (metal oxide semiconductor field effect transistor).

The output receiving circuit 13 receives an output signal from the level shift circuit 12. The output receiving circuit 13 comprises a PMOS transistor P1 which is a p channel type MOSFET and a resistor R2. The output receiving circuit 13 together with the level shift circuit 12 can be referred to as a level shift circuit.

The CMOS circuit 14 includes n pieces of PMOS transistors P2-1 through P2-$n$ and m pieces of NMOS transistors N2-1 through N2-$m$. At least one of the n PMOS transistors P2-1 through P2-$n$ can be replaced by a resistor; and at least one of the m NMOS transistors N2-1 through N2-$m$ can be replaced by a resistor.

Electrical connections among terminals and components in the power conversion equipment including the HVIC are as follows.

An input terminal of the control circuit 11 is connected to the input terminal H-IN, and an output terminal of the control circuit 11 is connected to the gate of the NMOS transistor N1.

The cathode of the diode D1 is connected to one terminal of the resistor R1, the source of the PMOS transistor P1, the sources of the PMOS transistors P2-1 and P2-$n$, and the high potential terminal H-VDD. The high potential terminal H-VDD is connected to the positive side terminal of the power supply V1.

The anode of the diode D1 is connected to the other terminal of the resistor R1, the gate of the PMOS transistor P1, and the drain of the NMOS transistor N1. The source of the NMOS transistor N1 is connected to the ground.

The drain of the PMOS transistor P1 is connected to one terminal of the resistor R2, a gate of the PMOS transistor P2-1, and the gate of the NMOS transistor N2-1.

The other end of the resistor R2 is connected to the sources of the NMOS transistors N2-1 and N2-$m$ and the intermediate potential terminal Vs. The intermediate terminal Vs is connected to the negative side terminal of the power supply V1, the emitter of the IGBT 21a, the anode of the diode D21, the collector of the IGBT 22a, and the cathode of the diode D22.

The drain of the PMOS transistor P2-$n$ is connected to the drain of the NMOS transistor N2-$m$ and the output terminal H-OUT. The output terminal H-OUT is connected to the gate of the IGBT 21a.

The drain of the PMOS transistor P2-1 is connected to the drain of the NMOS transistor N2-1 and other CMOS circuits not depicted in the figure.

The gate of the PMOS transistor P2-$n$ is connected to the gate of the NMOS transistor N2-$m$ and other CMOS circuits not depicted in the figure.

The collector of the IGBT 21a and the cathode of the diode D21 are connected to the power supply Vss; and the emitter of the IGBT 22a and the anode of the diode D22 are connected to the ground.

A high potential VB is applied from the power supply V1 to the high potential terminal H-VDD. The high potential VB is the highest potential applied to the HVIC 10. The potential Vs at the intermediate potential terminal Vs is a potential at the node between the high potential side switching element and the low voltage side switching element of the bridge circuit 20. The potential Vs is the base potential of the CMOS circuit 14 in the HVIC 10.

Now, the operation of the HVIC 10 will be described in the following. The HVIC 10 delivers a signal for driving the gate of the switching element according to the level of the input signal s1 given to the input terminal H-IN of the HVIC 10.

The signal for driving the gate of the switching element is the output signal from the output terminal H-OUT of the HVIC 10 adjusted to be able to turn ON/OFF the IGBT 21a.

Here a description is made on the procedure starting from an OFF state of the IGBT 21a, then turning into an ON state of the IGBT 21a, and holding at the ON state. In this procedure, the switching element IGBT 21a changes from an OFF state to an ON state when the level of the input signal s1 changes from L to H.

When the level of the input signal s1 changes from L to H, the NMOS transistor N1 turns to an ON state to run a current I1 through the level shift resistor R1 thereby decreasing the gate voltage of the PMOS transistor P1 from the voltage VB to the voltage VB−I1×R1.

As a result, the PMOS transistor P1 turns ON from the OFF state. The drain voltage of the PMOS transistor P1 changes from the voltage VS to the voltage VB. Corresponding to the change of the drain voltage of the PMOS transistor P1, the CMOS circuit 14 operates to deliver a signal for turning the IGBT 21a into an ON state from the output terminal H-OUT.

Here, the change of the gate voltage of the PMOS transistor P1 is not instantaneous but takes a certain delay time for varying from the voltage VB to the voltage VB−I1×R1. This delay is caused by a relatively large resistance value of the level shift resistor R1 and a relatively large parasitic capacitance value between the drain and source of the high withstand voltage NMOS transistor N1.

The time required by the variation of the gate voltage causes the requirement of certain time for the change of the PMOS transistor P1 from an OFF state to an ON state, which in turn causes requirement for a time until start of operation of the CMOS circuit 14.

The time duration required by the process until the turning ON of the PMOS transistor P1 is a portion of a signal transmission delay time, which is a time duration from the moment of change of the input signal s1 from the level L to the level H until the moment of change of the IGBT 21a from the OFF state to the ON state, and thus one factor to delay the signal transmission process.

FIG. 4 shows variation of the gate voltage and the drain voltage of the PMOS transistor P1 corresponding to the change of the level of the input signal s1.

The time chart g1 shows the change of the level of the input signal s1. The ordinate represents the voltage of the input signal s1 and the abscissa represents the time t.

The time chart g2 shows the change of the level of the gate voltage of the PMOS transistor P1. The variation of the level of the gate voltage is equal to the variation of the level of the gate driving signal delivered from the level shift circuit 12. The ordinate represents the gate voltage of the PMOS transistor P1 and the abscissa represents the time.

The time chart g3 shows the variation of the level of the voltage of the output signal, which is a drain voltage, of the PMOS transistor P1. The ordinate represents the output voltage, which is a drain voltage, of the PMOS transistor P1 and the abscissa represents the time.

In the period t0≤t<t1, the input signal s1 is at the L level, and the gate voltage of the PMOS transistor P1 is the voltage VB. The drain voltage of the PMOS transistor P1 is the voltage VS.

At the time t=t1, the input signal s1 change from the L level to the H level, and the NMOS transistor N1 in the level shift circuit 12 turns ON.

In the period t1<t<t2, the gate voltage of the PMOS transistor P1 starts to decrease from the voltage VB.

At the time t=t2, the gate voltage of the PMOS transistor P1 decreases to the threshold voltage Vtp1 of the PMOS transistor P1 and the PMOS transistor P1 turns from the OFF state to the ON state. The output signal, which is the drain voltage, of the PMOS transistor P1 changes from the voltage VS to the voltage VB.

In the period t2<t<t3, the gate voltage of the PMOS transistor P1 decreases down to the voltage VB−I1×R1.

In the period t3≤t, the input signal s1 is at an H level, and the gate voltage of the PMOS transistor P1 is the voltage VB−I1×R1. The drain voltage of the PMOS transistor P1 is the voltage VB.

The CMOS circuit 14 starts to operate responding to the input of variation of the output signal, which is the drain voltage, of the PMOS transistor P1. As a result, as shown in FIG. 4, a delay of time td occurs from the change of the input signal s1 to the change of the output signal of the PMOS transistor P1.

Thus, the level shift control by the HVIC is one of the factors to delay a response time of switching element to the variation of the input signal level. In order to decrease this delay time, it could be assumed to reduce the resistance value of the level shift resistor R1. However, that measure involves disadvantage of increase in power consumption in the HVIC 10.

In an effort to decrease the delay time, the conventional technology disclosed in Patent Document 1 decreases the parasitic capacitance of the NMOS transistor in the level shift circuit. In that measure, the drift region of the NMOS transistor is made at a floating potential, which tends to cause malfunctions of the NMOS transistor. The other conventional technology disclosed in Patent Document 2 proposes an HVIC to avoid malfunctioning, but fails to mention about decrease of delay time.

Embodiments of the present invention have been made in view of these circumstances, and an aspect of the embodiments is to provide a semiconductor device and a power conversion equipment in which power consumption is maintained at a low level, any malfunctioning is avoided, and a delay time in signal transmission is decreased to make signal transmission process faster.

Now, an embodiment of the present invention will be described in detail in the following.

Figure 5:
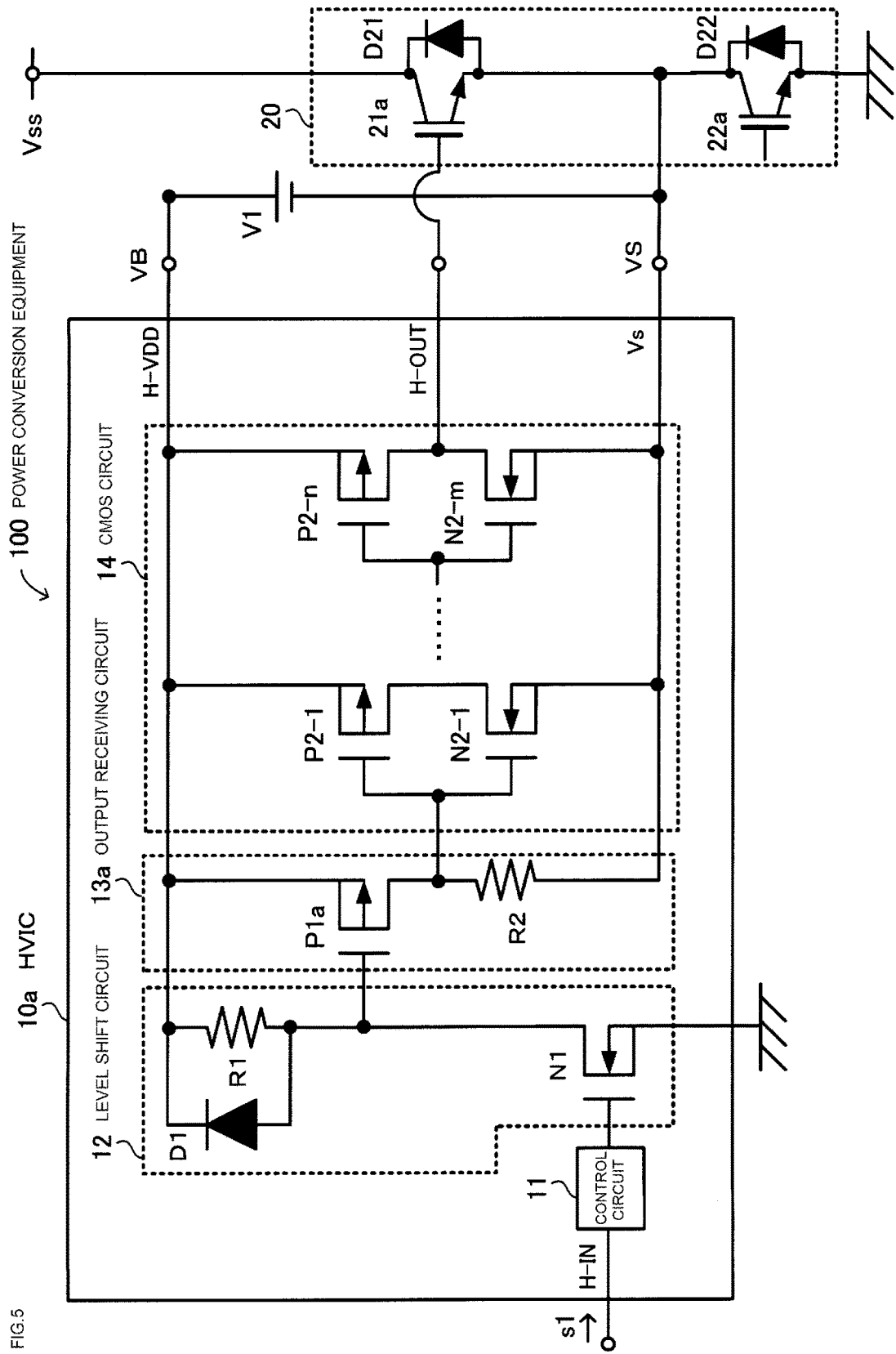
FIG. 5 shows another example of construction of an HVIC.

FIG. 5 shows an example of construction of an HVIC according to an embodiment of the present invention. The figure illustrates the essential parts within the HVIC 10 that drives the upper arm of the bridge circuit 20 as well as peripheral circuits in a power conversion equipment 100.

The HVIC 10a comprises a control circuit 11, a level shift circuit 12, an output receiving circuit 13a, and a CMOS circuit 14. The output receiving circuit 13a performs the function of the anterior stage circuit 1b in FIG. 1. The CMOS circuit 14 performs functions of the posterior stage circuit 1c in FIG. 1.

The control circuit 11 receives the input signal s1 from the input terminal H-IN and drives the level shift circuit 12.

The level shift circuit 12 includes a diode D1, a level shift resistor R1, and a high withstand voltage NMOS transistor N1, which is an n channel type MOSFET.

The output receiving circuit 13a receives an output signal from the level shift circuit 12. The output receiving circuit 13a comprises a PMOS transistor P1a which is a p channel type MOSFET and a resistor R2. The resistor R2 can be replaced by a depletion type NMOS transistor. The output receiving circuit 13a together with the level shift circuit 12 can be incorporated into a level shift circuit.

The CMOS circuit 14 includes at least one PMOS transistor and at least one NMOS transistor. The CMOS circuit 14 of the construction of FIG. 5 includes n pieces of PMOS transistors P2-1 through P2-$n$ and $m$ pieces of NMOS transistors N2-1 through N2-$m$.

The PMOS transistor P1a corresponds to the transistor Tr1 indicated in FIG. 1. The PMOS transistors P2-1 through P2-$n$ correspond to the transistor Tr2 in FIG. 1.

In the HVIC 10a, the threshold voltage Vtp1 of the PMOS transistor P1a is lower than the threshold voltage Vtp2 of the PMOS transistors P2-1 through P2-$n$ included in the CMOS circuit 14: Vtp1<Vtp2. The threshold voltages here are absolute values. Electrical connection among terminals and components is omitted here because it is the same as the one in FIG. 3.

Ordinary semiconductor devices are so manufactured that the threshold voltages are approximately equal among the MOS transistors of every conductivity type composing the circuit.

In contrast, the threshold voltages in the embodiment of the present invention is so adjusted as to have different threshold voltage values between Vtp1 and Vtp2 by adjusting dimensions and impurity concentration. By adjusting the threshold voltage Vtp1 to be lower than the threshold voltage Vtp2, the PMOS transistor P1a turns ON earlier than conventional circuits thereby shortening the signal transmission delay time.

FIG. 6 shows variation of the gate voltage and the drain voltage of the PMOS transistor P1a responding to the change of the level of the input signal s1.

The time chart g11 shows the change of the level of the input signal s1. The ordinate represents the voltage of the input signal s1 and the abscissa represents the time t.

The time chart g12 shows the change of the level of the gate voltage of the PMOS transistor P1a. The variation of the level of the gate voltage is equal to the variation of the level of the gate driving signal delivered from the level shift circuit 12. The ordinate represents the gate voltage of the PMOS transistor P1a and the abscissa represents the time t.

The time chart g13 shows the variation of the level of the voltage of the output signal, which is a drain voltage, of the PMOS transistor P1a. The ordinate represents the output voltage, which is a drain voltage, of the PMOS transistor P1a and the abscissa represents the time t.

In the period t0≤t<t11, the input signal s1 is at the L level, and the gate voltage of the PMOS transistor P1a is the voltage VB. The drain voltage of the PMOS transistor P1a is the voltage VS.

At the time t=t11, the input signal s1 change from the L level to the H level, and the NMOS transistor N1 in the level shift circuit 12 turns ON.

In the period t11<t<t12, the gate voltage of the PMOS transistor P1a starts to decrease from the voltage VB.

At the time t=t12, the gate voltage of the PMOS transistor P1a decreases to the threshold voltage Vtp1 of the PMOS transistor P1a and the PMOS transistor P1a turns from the OFF state to the ON state. The output signal, which is the drain voltage, of the PMOS transistor P1a changes from the voltage VS to the voltage VB.

In the period t12<t<t13, the drain voltage of the PMOS transistor P1a is the voltage VB.

In the period t13≤t<t14, the gate voltage of the PMOS transistor P1a decreases down to the voltage VB−I1×R1.

In the period t14≤t, the input signal s1 is at an H level, and the gate voltage of the PMOS transistor P1a is the voltage VB−I1×R1. The drain voltage of the PMOS transistor P1a is the voltage VB.

In the HVIC 10 described referring to FIG. 3, the threshold voltage Vtp1 of the PMOS transistor P1 is equal to the threshold voltage Vtp2 of the PMOS transistors P2-1 through P2-n: Vtp1=Vtp2. In that case, the signal transmission delay time td1=td2=td.

On the other hand, in the HVIC 10a depicted in FIG. 5, the threshold voltage Vtp1 of the PMOS transistor P1a is lower than the threshold voltage Vtp2 of the PMOS transistors P2-1 through P2-n: Vtp1<Vtp2. Thus, the signal transmission delay time td1<td2=td. The signal transmission delay time is decreased by the time period of td2−td1 as compared with the conventional HVIC 10.

If threshold voltages are lowered in both the PMOS transistor P1a and every PMOS transistors P2-1 through P2-n included in the CMOS circuit 14, disadvantages arises that the power consumption in the HVIC increases and malfunction tends to occur in the HVIC. Accordingly, in the HVIC 10a, only the threshold voltage of the PMOS transistor P1a is lowered.

As described above, embodiments of the present invention shorten the signal transmission delay time while avoiding increase of power consumption and occurrence of malfunction without restructuring the device structure of the high withstand voltage NMOS comprising the level shift circuit.

Figure 7:
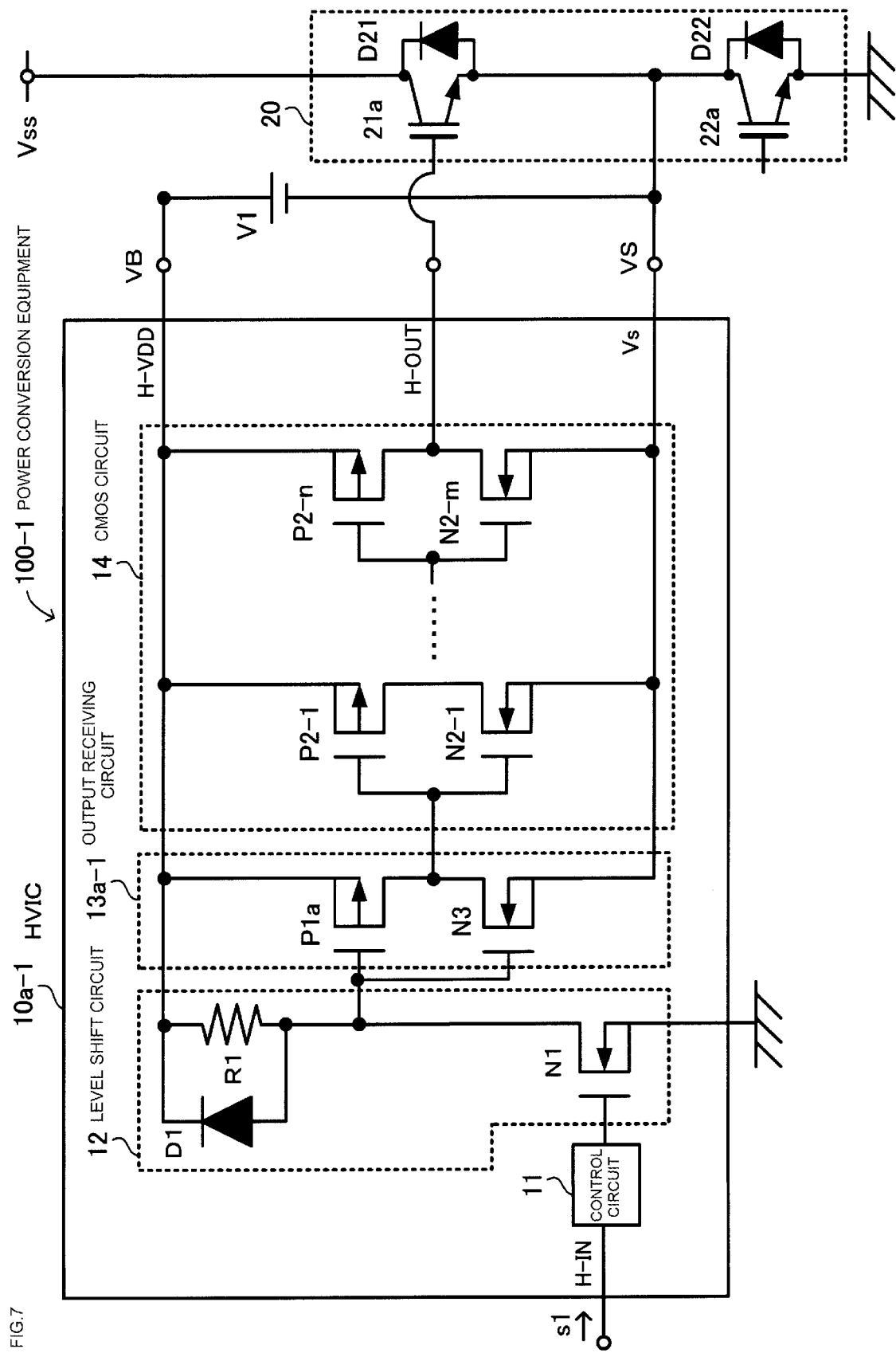
FIG. 7 shows a construction of a first variation example of an HVIC.

The following describes some variation examples of the HVIC 10a. FIG. 7 shows construction of a first variation example of an HVIC. The figure illustrates the essential parts within the HVIC 10a-1 that drives the upper arm of the bridge circuit 20 as well as peripheral circuits in power conversion equipment 100-1.

The HVIC 10a-1 of the first variation example comprises a control circuit 11, a level shift circuit 12, an output receiving circuit 13a-1, and a CMOS circuit 14.

The control circuit 11 receives the input signal s1 from the input terminal H-IN and drives the level shift circuit 12.

The level shift circuit 12 includes a diode D1, a level shift resistor R1, and a high withstand voltage NMOS transistor N1, which is an n channel type MOSFET.

The output receiving circuit 13a-1 receives an output signal from the level shift circuit 12. The output receiving circuit 13a-1 comprises a PMOS transistor P1a which is a p channel type MOSFET and an NMOS transistor N3 which is an n channel type MOSFET. The output receiving circuit 13a-1 constructs an inverter circuit. The output receiving circuit 13a-1 together with the level shift circuit 12 can be incorporated into a level shift circuit.

The CMOS circuit 14 includes n pieces of PMOS transistors P2-1 through P2-n and m pieces of NMOS transistors N2-1 through N2-m.

Electrical connections among terminals and components in the power conversion equipment are as follows.

of the control circuit 11 is connected to an input terminal H-IN, and an output terminal of the control circuit 11 is connected to the gate of the NMOS transistor N1.

The cathode of the diode D1 is connected to one terminal of the resistor R1, the source of the PMOS transistor P1a, the sources of the PMOS transistors P2-1 and P2-n, and the high potential terminal H-VDD. The high potential terminal H-VDD is connected to the positive side terminal of the power supply V1.

The anode of the diode D1 is connected to the other terminal of the resistor R1, the gate of the PMOS transistor P1a, the gate of the NMOS transistor N3, and the drain of the NMOS transistor N1. The source of the NMOS transistor N1 is connected to the ground.

The drain of the PMOS transistor P1a is connected to the drain of the MMOS transistor N3, the gate of the PMOS transistor P2-1, and the gate of the NMOS transistor N2-1.

The source of the NMOS transistor N3 is connected to the sources of the NMOS transistors N2-1 and N2-m, and the intermediate potential terminal Vs. The intermediate potential terminal Vs is connected to the negative side terminal of the power supply V1, the emitter of the IGBT 21a, the anode of the diode D21, the collector of the IGBT 22a, and the cathode of the diode D22.

The drain of the PMOS transistor P2-n is connected to the drain of the NMOS transistor N2-m and the output terminal H-OUT. The output terminal H-OUT is connected to the gate of the IGBT 21a.

The drain of the PMOS transistor P2-1 is connected to the drain of the NMOS transistor N2-1 and other CMOS circuits not depicted in the figure.

The gate of the PMOS transistor P2-n is connected to the gate of the NMOS transistor N2-m and other CMOS circuits not depicted in the figure.

The collector of the IGBT 21a and the cathode of the diode D21 are connected to the power supply Vss; and the emitter of the IGBT 22a and the anode of the diode D22 are connected to the ground.

Figure 8:
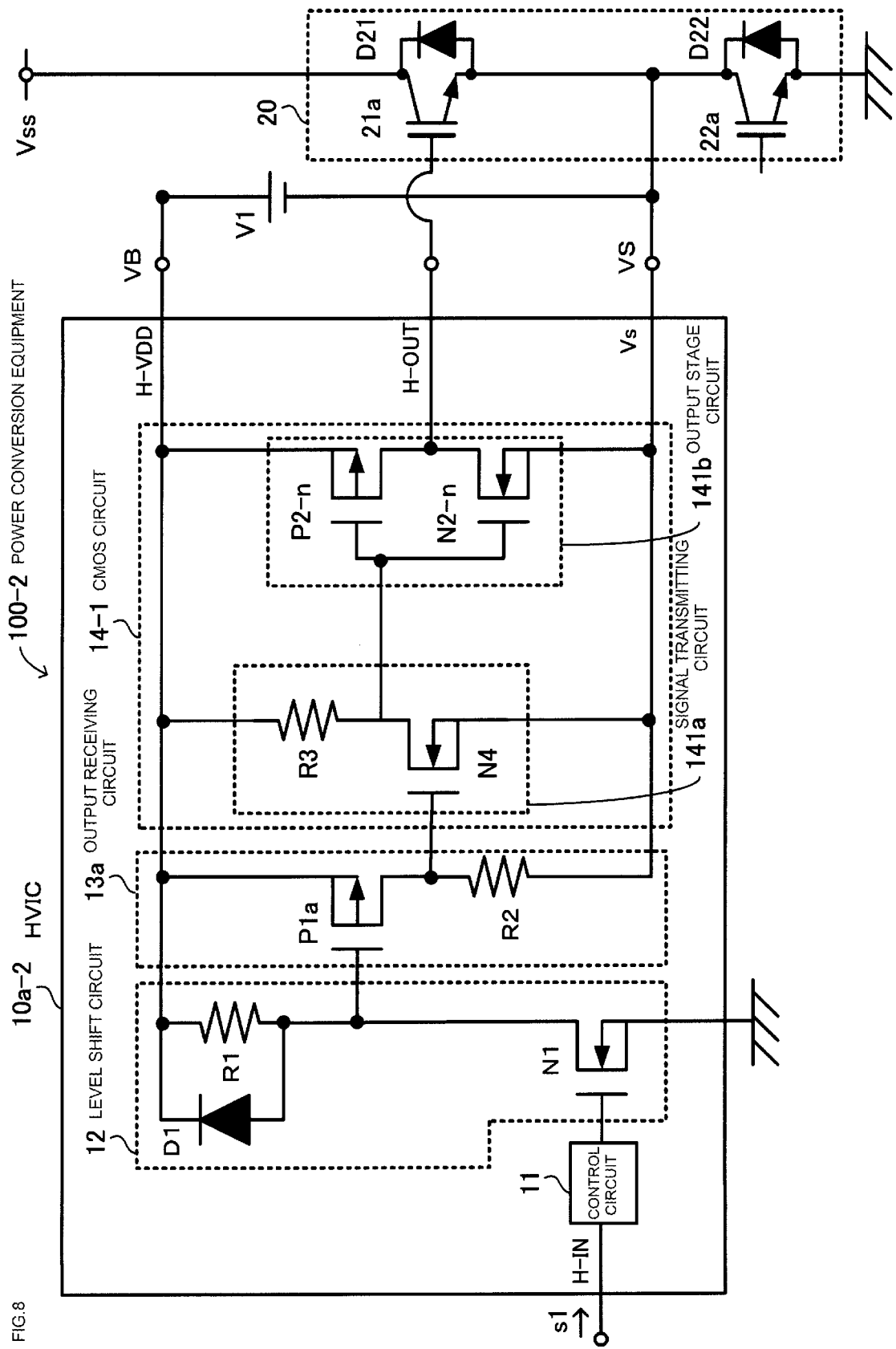
FIG. 8 shows a construction of a second variation example of an HVIC.

FIG. 8 shows a construction of second variation example of an HVIC. The figure illustrates the essential parts within the HVIC 10a-2 that drives the upper arm of the bridge circuit 20 as well as peripheral circuits in power conversion equipment 100-2.

The HVIC 10a-2 of the second variation example comprises a control circuit 11, a level shift circuit 12, an output receiving circuit 13a, and a CMOS circuit 14-1.

The control circuit 11 receives the input signal s1 from the input terminal H-IN and drives the level shift circuit 12.

The level shift circuit 12 includes a diode D1, a level shift resistor R1, and a high withstand voltage NMOS transistor N1, which is an n channel type MOSFET.

The output receiving circuit 13a receives an output signal from the level shift circuit 12. The output receiving circuit 13a comprises a PMOS transistor P1a which is a p channel type MOSFET and a resistor R2. The output receiving circuit 13a can be included in the level shift circuit 12.

The CMOS circuit 14-1 comprises a signal transmitting circuit 141a and an output stage circuit 141b. The signal transmitting circuit 141a includes a resistor R3 and an NMOS transistor N4; and the output stage circuit 141b includes a PMOS transistor P2-n and an NMOS transistor N2-n.

The signal transmitting circuit 141a performs switching operation thereof according to the output signal from the output receiving circuit 13a and transmits the output signal to the PMOS transistor P2-n.

Electrical connections among terminals and components in the power conversion equipment are as follows.

An input terminal of the control circuit 11 is connected to an input terminal H-IN, and an output terminal of the control circuit 11 is connected to the gate of the NMOS transistor N1.

The cathode of the diode D1 is connected to one terminal of the resistor R1, the source of the PMOS transistor P1a, one terminal of the resistor R3, the source of the PMOS transistors P2-n, and the high potential terminal H-VDD. The high potential terminal H-VDD is connected to the positive side terminal of the power supply V1.

The anode of the diode D1 is connected to the other terminal of the resistor R1, the gate of the PMOS transistor P1a, and the drain of the NMOS transistor N1. The source of the NMOS transistor N1 is connected to the ground.

The drain of the PMOS transistor P1a is connected to one terminal of the resistor R2 and the gate of the NMOS transistor N4.

The other terminal of the resistor R2 is connected to the source of the NMOS transistor N4, the source of the NMOS transistor N2-n, and the intermediate potential terminal Vs. The other terminal of the resistor R3 is connected to the drain of the NMOS transistor N4, the gate of the PMOS transistor P2-n, and the gate of the NMOS transistor N2-n.

The intermediate potential terminal Vs is connected to the negative side terminal of the power supply V1, the emitter of the IGBT 21a, the anode of the diode D21, the collector of the IGBT 22a, and the cathode of the diode D22.

The drain of the PMOS transistor P2-n is connected to the drain of the NMOS transistor N2-n and the output terminal H-OUT. The output terminal H-OUT is connected to the gate of the IGBT 21a. The collector of the IGBT 21a and the cathode of the diode D21 are connected to the power supply Vss; and the emitter of the IGBT 22a and the anode of the diode D22 are connected to the ground.

The output receiving circuit 13a of the HVIC 10a-2 described above can have the construction of the output receiving circuit 13a-1 shown in FIG. 7. A latching circuit and a protection circuit can be provided between the signal transmitting circuit 141a and the output stage circuit 141b. The signal transmitting circuit 141a can be omitted in order to reduce a circuit scale.

Figure 9:
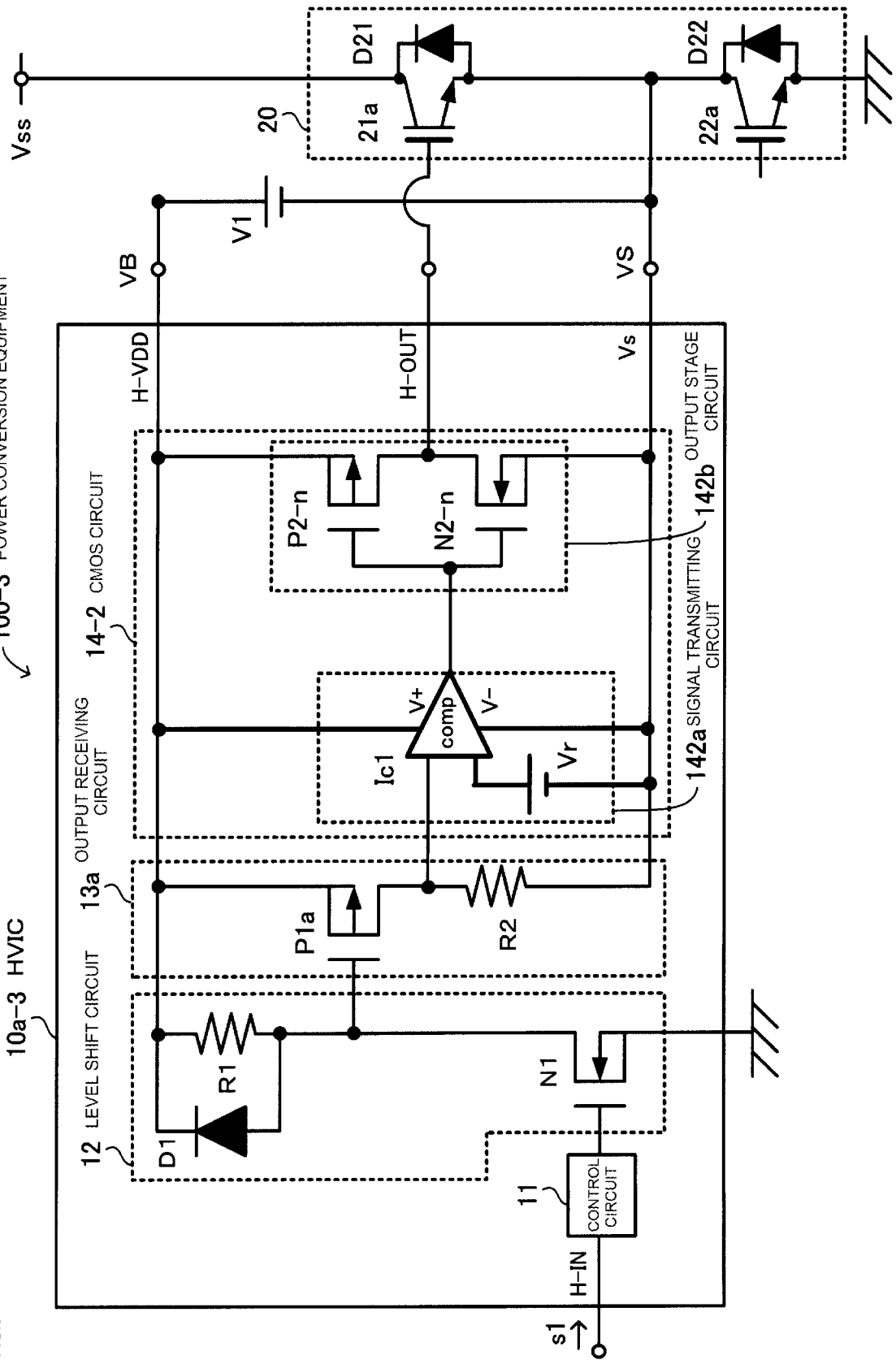
FIG. 9 shows a construction of a third variation example of an HVIC.

FIG. 9 shows construction of a third variation example of an HVIC. The figure illustrates the essential parts within the HVIC 10a-3 that drives the upper arm of the bridge circuit 20 as well as peripheral circuits in a power conversion equipment 100-3.

The HVIC 10a-3 of the third embodiment example comprises a control circuit 11, a level shift circuit 12, an output receiving circuit 13a, and a CMOS circuit 14-2.

The control circuit 11 receives the input signal s1 from the input terminal H-IN and drives the level shift circuit 12.

The level shift circuit 12 includes a diode D1, a level shift resistor R1, and a high withstand voltage NMOS transistor N1, which is an n channel type MOSFET.

The output receiving circuit 13a receives an output signal from the level shift circuit 12. The output receiving circuit 13a comprises a PMOS transistor P1a which is a p channel type MOSFET and a resistor R2. The output receiving circuit 13a can be included in the level shift circuit 12.

The CMOS circuit 14-2 comprises a signal transmitting circuit 142a and an output stage circuit 142b. The signal transmitting circuit 142a includes a reference power supply Vr and a comparator Ic1; and the output stage circuit 142b includes a PMOS transistor P2-n and an NMOS transistor N2-n.

The signal transmitting circuit 142a compares the level of the output signal from the output receiving circuit 13a with the reference voltage Vr. When the output signal level exceeds the reference voltage Vr, the output signal is transmitted to the PMOS transistor P2-n.

Electrical connections among terminals and components in the power conversion equipment are as follows.

An input terminal of the control circuit 11 is connected to an input terminal H-IN, and an output terminal of the control circuit 11 is connected to the gate of the NMOS transistor N1.

The cathode of the diode D1 is connected to one terminal of the resistor R1, the source of the PMOS transistor P1a, the positive side power supply terminal V+ of the comparator Ic1, the source of the PMOS transistors P2-n, and the high potential terminal H-VDD. The high potential terminal H-VDD is connected to the positive side terminal of the power supply V1.

The anode of the diode D1 is connected to the other terminal of the resistor R1, the gate of the PMOS transistor P1a, and the drain of the NMOS transistor N1. The source of the NMOS transistor N1 is connected to the ground.

The drain of the PMOS transistor P1a is connected to one terminal of the resistor R2 and one of the input terminals of the comparator Ic1. The other input terminal of the comparator Ic1 is connected to the positive side terminal of the reference power supply Vr.

The other terminal of the resistor R2 is connected to the negative side terminal of the reference power supply Vr, the negative side power supply terminal V− of the comparator Ic1, the source of the NMOS transistor N2-n, and the intermediate potential terminal Vs.

The output terminal of the comparator Ic1 is connected to the gate of the PMOS transistor P2-n and the gate of the NMOS transistor N2-n.

The intermediate potential terminal Vs is connected to the negative side terminal of the power supply V1, the emitter of the IGBT 21a, the anode of the diode D21, the collector of the IGBT 22a, and the cathode of the diode D22.

The drain of the PMOS transistor P2-n is connected to the drain of the NMOS transistor N2-n and the output terminal H-OUT. The output terminal H-OUT is connected to the gate of the IGBT 21a.

The collector of the IGBT 21a and the cathode of the diode D21 are connected to the power supply Vss; and the emitter of the IGBT 22a and the anode of the diode D22 are connected to the ground.

The output receiving circuit 13a of the HVIC 10a-3 can have the construction of the output receiving circuit 13a-1 shown in FIG. 7. A latching circuit and a protection circuit can be provided between the signal transmitting circuit 142a and the output stage circuit 142b. The signal transmitting circuit 142a can be omitted in order to reduce circuit scale.

The constructions of embodiment examples as shown thus far can be replaced by other similar constructions that performs similar functions. Further, the constructions of the embodiment examples allow addition of other structures or processes.

Reference signs and numerals are as follows:
1: semiconductor device
1a: level shift circuit
1b: anterior circuit
1c: posterior circuit
Sw1: switching element
Tr1, Tr2: transistor
Vtp1, Vtp2: threshold voltage
ga: time chart of variation of input signal level
gb-1, gb-2: time chart of variation of output signal level of a transistor
ta: time of change in input signal level
TDa, TDb: delay time Although a few embodiments have been shown and described, it would be appreciated by those skilled in the art that changes may be made in these embodiments without departing from the principles and spirit of the invention, the scope of which is defined in the claims and their equivalents.

What is claimed is:

1. A semiconductor device for driving a switching element comprising:
    a level shift circuit that transmits an input signal of a primary potential system to a secondary potential system different from the primary potential system;
    an anterior stage circuit that comprises a first p channel type MOS transistor configured to receive a gate driving signal delivered by the level shift circuit; and
    a posterior stage circuit that comprises one or more second p channel type MOS transistors and drives the switching element according to an output signal from the first transistor,
    a first threshold voltage of the first transistor being lower than a second threshold voltage of the one or more second p channel type MOS transistors, and
    the switching element being connectable to a high potential side.

2. The semiconductor device according to claim 1, wherein
    a gate of the first p channel type MOS transistor is connected to the level shift circuit and receives the gate driving signal;
    a source of the first p channel type MOS transistor is connected to the maximum potential applied to the semiconductor device; and
    a drain of the first p channel type MOS transistor is connected to the posterior stage circuit.

3. The semiconductor device according to claim 2, wherein the anterior stage circuit comprises an inverter circuit including the first p channel type MOS transistor and an n channel type MOS transistor.

4. The semiconductor device according to claim 2, wherein the drain of the first p channel type MOS transistor is connected to a gate of the one or more second p channel type MOS transistors.

5. The semiconductor device according to claim 2, wherein the posterior stage circuit has a signal transmission circuit that performs switching operation thereof according to the output signal from the anterior stage circuit and transmits the output signal to the one or more second p channel type MOS transistors.

6. The semiconductor device according to claim 2, wherein the posterior stage circuit has a signal transmission circuit that compares a level of the output signal from the anterior stage circuit with a reference voltage, and transmits the output signal to the one or more second p channel type MOS transistors if the level of the output signal is higher than the reference voltage.

7. The semiconductor device according to claim 2, wherein the source of the first p channel type MOS transistor is connected to a source of the one or more second p channel type MOS transistors and to the maximum potential applied to the semiconductor device.

8. The semiconductor device according to claim 1, further comprising a control circuit, wherein the level shift circuit is configured to turn the first transistor on and off according to an output of the control circuit.

9. A power conversion equipment comprising:
    a bridge circuit that has a switching element in a high potential side and a switching element in a low potential side, both connected in series, and that is connected to a load at a middle potential point between the switching element in the high potential side and the switching element in the low potential side; and
    a semiconductor device that comprises:
        a level shift circuit that transmits an input signal of a primary potential system to a secondary potential system different from the primary potential system;
        an anterior stage circuit that comprises a first p channel type MOS transistor configured to receive a gate driving signal delivered by the level shift circuit; and
        a posterior stage circuit that comprises one or more second p channel type MOS transistors and drives the switching element in the high potential side according to an output signal from the first transistor,
    a first threshold voltage of the first transistor being lower than a second threshold voltage of the one or more second p channel type MOS transistors.

* * * * *